(12) United States Patent
Choi

(10) Patent No.: US 9,231,561 B2
(45) Date of Patent: Jan. 5, 2016

(54) MULTI-STAGE ADAPTIVE FILTER

(75) Inventor: Yang-Seok Choi, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 1031 days.

(21) Appl. No.: 13/341,872

(22) Filed: Dec. 30, 2011

(65) Prior Publication Data

US 2013/0173678 A1 Jul. 4, 2013

(51) Int. Cl.
*H03H 17/00* (2006.01)
*H03H 17/02* (2006.01)
*H03H 21/00* (2006.01)
*H04L 25/03* (2006.01)

(52) U.S. Cl.
CPC .......... *H03H 17/00* (2013.01); *H03H 17/0294* (2013.01); *H03H 21/0012* (2013.01); *H04L 25/03038* (2013.01); *H03H 2021/0072* (2013.01); *H04L 2025/037* (2013.01); *H04L 2025/03636* (2013.01)

(58) Field of Classification Search
None
See application file for complete search history.

(56) References Cited

U.S. PATENT DOCUMENTS

| | | | | |
|---|---|---|---|---|
| 5,282,155 | A  * | 1/1994 | Jones | 708/322 |
| 7,103,177 | B2 * | 9/2006 | Tanrikulu et al. | 379/406.14 |
| 7,433,908 | B2 * | 10/2008 | Tanrikulu et al. | 708/322 |
| 2011/0264722 | A1 * | 10/2011 | Wu | 708/322 |

OTHER PUBLICATIONS

T. Aboulnasr and K. Mayyas, "Selective coefficient update of gradient-based adaptive algorithms", Proc. IEEE Conference on Acoustics, Speech, and Signal Processing, vol. 3, pp. 1929-1932, 1997.*
T. Aboulnasr and K. Mayyas, "Complexity reduction of the NLMS algorithm via selective coefficient update", IEEE Trans. Signal Process., vol. 47, No. 5, pp. 1421-1424, 1999.*
P. A. Naylor and W. Sherliker, "A short-sort M-max NLMS partial update adaptive filter with applications to echo cancellation", Proc. IEEE International Conference on Acoustics, Speech, and Signal Processing, vol. 5, pp. 373-376, 2003.*

* cited by examiner

*Primary Examiner* — Chuong D Ngo
*Assistant Examiner* — Matthew Sandifer
(74) *Attorney, Agent, or Firm* — Carrie A. Boone P.C.

(57) ABSTRACT

A multi-stage adaptive filter is disclosed, which exhibits a smaller mean square error than in prior art adaptive filters. The adaptive filter selectively manipulates the weights, in multiple stages, so as to achieve a global minimum of the error function, such that the filtered signal has as small an error as possible.

20 Claims, 7 Drawing Sheets

MULTI-STAGE ADAPTIVE FILTER

TECHNICAL FIELD

This application relates to adaptive filters.

BACKGROUND

An adaptive filter is used to adaptively identify a channel, equalize a channel, or cancel echoes (or multipath) in wired and wireless communications. The adaptive filter structure may be used in adaptive beamforming as well.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a multi-stage adaptive filter is disclosed, which exhibits a smaller mean square error than in prior art adaptive filters. The adaptive filter manipulates the weights, in each stage, so as to achieve a global minimum or better local minimum of the error function, such that the filtered signal has as small an error as possible.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. The following detailed description is, therefore, not to be construed in a limiting sense, as the scope of the subject matter is defined by the claims.

Figure 1:
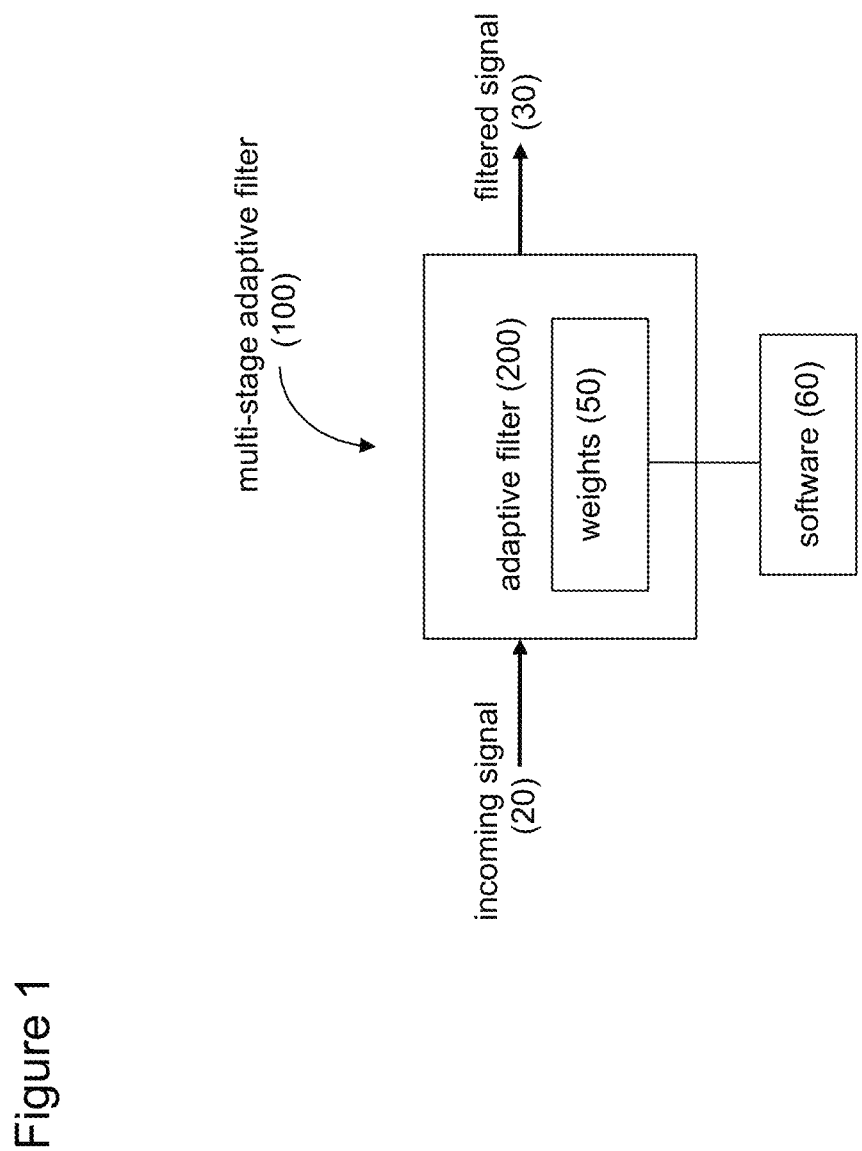
FIG. 1 is a block diagram of a multi-stage adaptive filter, according to some embodiments.

FIG. 1 is a simplified block diagram of a multi-stage adaptive filter 100, according to some embodiments. The multi-stage adaptive filter 100 operates using software 60 that manipulates weights 50 such that they are ordered and selectively updated as a traditional adaptive filter 200 is run, in multiple stages, so as to process an incoming signal 20 as a filtered signal 30. The multi-stage adaptive filter 100 is described in more detail below.

Figure 2:
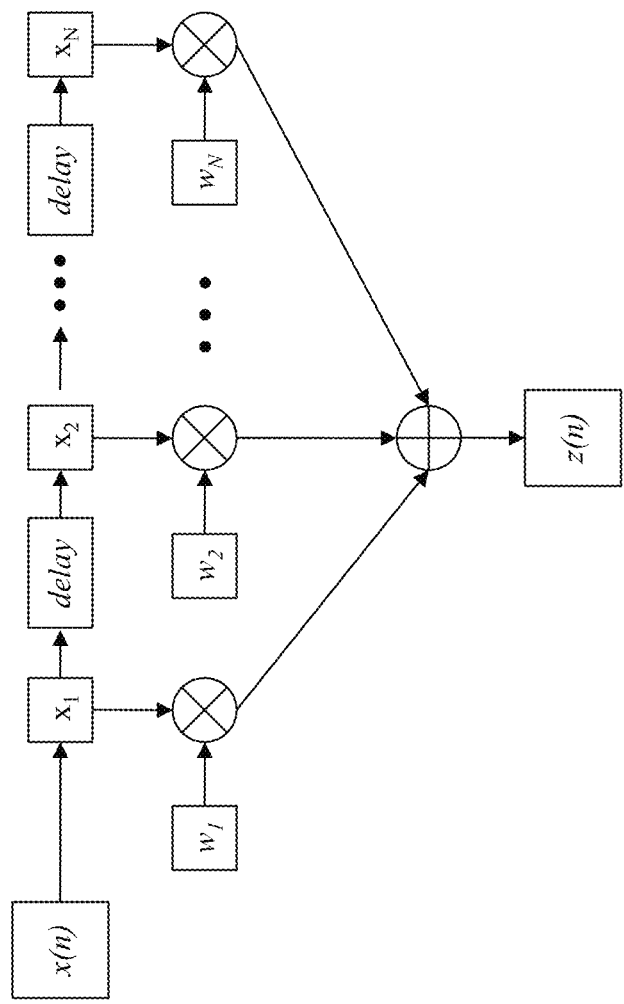
FIGS. 2 and 3 are diagrams of typical adaptive filters, used by the multi-stage adaptive filter of FIG. 1, according to the prior art.

FIG. 2 shows a typical structure of a filter 200A, which may be used by the adaptive filter 100, according to some embodiments. A signal, given by $x(n)=[x_1, x_2, \ldots, x_N]$ is received into the filter 200A, with a first portion of the signal, given by $x_1$, being multiplied by a first weight parameter, $w_1$. Then, after some delay, a next portion of the signal, given by $x_2$, is multiplied by a second weight parameter, $w_2$, and so on, until, after N delays, the final portion of the signal, $x_N$, is multiplied by the $N^{th}$ weight parameter, $w_N$. The multiplied results are then summed together as the result, $z(n)$.

Figure 3:
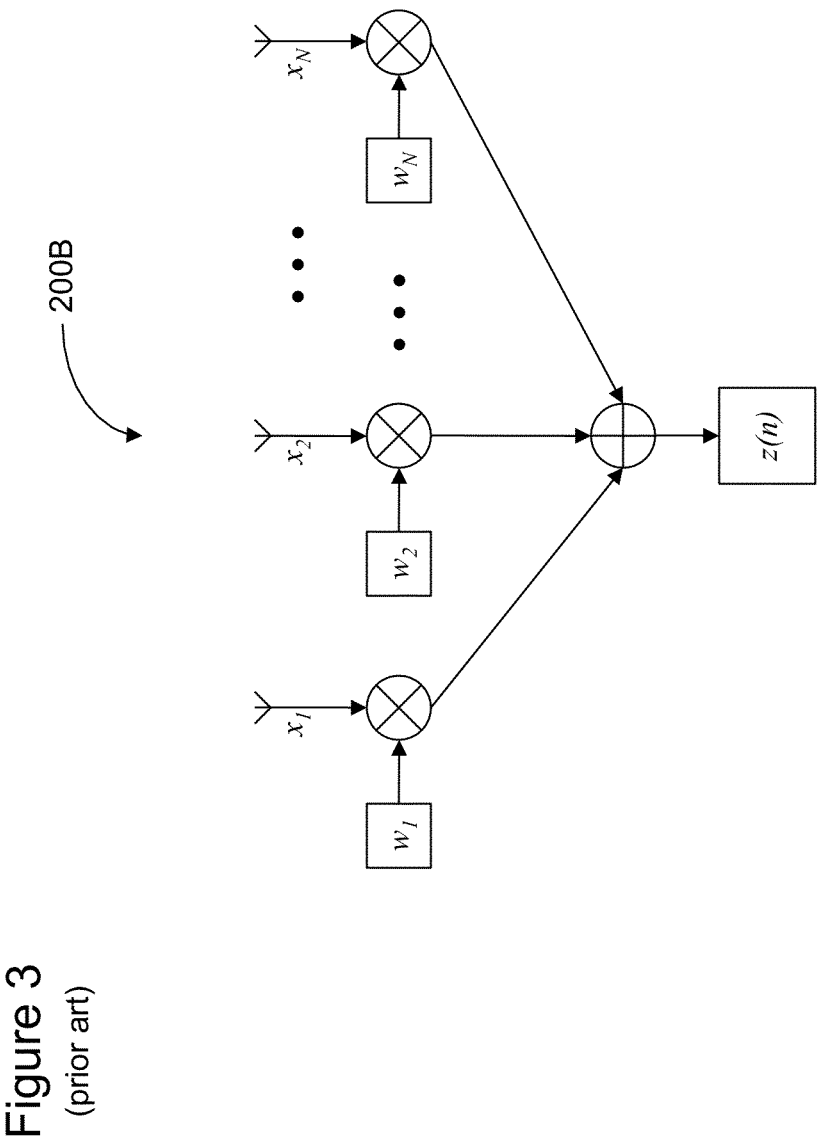

Similarly, in FIG. 3, a filter 200B, is another filter that may be used by the adaptive filter 100 of FIG. 1. The filter 200B features signal portions, $x_1, x_2, \ldots, x_N$, being received into the filter from different antennas, such as occurs during beamforming of the signal. The filter 200A or the filter 200B may be used by the adaptive filter 100, to receive the incoming signal 20 and generate the filtered signal 30.

Least mean square algorithms are a type of adaptive filter that incorporates an iterative process in which successive corrections are made to the weight vector so as to produce the least mean squares of the error signal, which is the difference between the actual signal and the desired signal. In the least mean square algorithm, the weight, w, for the adaptive filter is updated by the following equation:

$$w = w + \mu x^* e \quad (1)$$

where $x=[x(n), x(n-1), \ldots, x(n-N+1)]^T$, $w=[w_1, w_2, \ldots, w_N]^T$, $\mu$ is a step size, and e is an error signal calculated from a desired signal and $z(n)$.

In the constant modulus algorithm, the error signal, or cost function, is defined by the following equation:

$$e = z(n)(\text{constant} - |z(n)|^2) \quad (2)$$

In an adaptive filter, the weight vector, w, may change, with each iteration of the filter, until eventually converging to some value. During this convergence, the weight vector, w, may fall into a local minimum of the cost function instead of the global minimum.

For example, in an echo canceller and during channel identification, the ideal weight vector, w, should be equal to the impulse response of the channel. However, due to a non-zero value of $x(n-m+1)$ at the $m^{th}$ tap, from the above weight vector update equation (1), the $m^{th}$ tap, $w_m$, may be non-zero, even if the impulse response has a zero value at the $m^{th}$ delay. This causes a larger mean square error, even after convergence.

Multi-Stage Adaptive Filter

To solve the above problem, in some embodiments, the adaptive filter 100 uses a traditional adaptive filter, such as the adaptive filters 200A and 200B, in a novel way. The adaptive filter 100 organizes its weights 50 and uses that arrangement to update the weights in a step-wise fashion, rather than all at once.

First, the traditional adaptive filter 200 is run for a certain number of iterations. In some embodiments, the number of iterations is based on the signal-to-noise ratio and/or the eigenvalue spread of the autocorrelation matrix of the input signal 20. Once the weight vectors 50 converge after running the traditional adaptive filter 200, the software 60 orders the weights 50 such that the absolute value each succeeding weight is the same as or exceeds the previous weight, given by the following formula:

$$|w_{i_k}| \geq |w_{i_{k+1}}| \quad (3)$$

for integer $i_k$. The indices of the weights then tell which weights will be updated at the kth stage. As shown in FIG. 1, the weights 50 are all then reset to zero. For the first stage, the first weight, $w_{i_1}$, is the only weight that is updated, with all other weights remaining set to zero. The weight is run through the filter 200 until the weight converges.

After convergence of $w_{i_1}$, two weights, $w_{i_1}$ and $w_{i_2}$, are updated simultaneously, with the remaining weights being set to zero. The filter 200 is run again until the weights converge. Again, after convergence of two weights, $w_{i_1}$ and $w_{i_2}$, the first three weights, $w_{i_1}$, $w_{i_2}$, and $w_{i_3}$ are updated simultaneously, with all other weights remaining set to zero, and the filter 200 is run again. This process is repeated until the $N^{th}$ stage.

The multi-stage process 100 illustrated in FIG. 1 may be stated mathematically as follows:
for k=1 to N
weights $\{w_{i_1}, w_{i_2}, \ldots, w_{i_k}\}$ are updated
end For example, assume that the traditional adaptive filter 200 is run for the predetermined number of iterations, after which the following weights are obtained: $|w_1|=0.5$, $|w_2|=1.1$, $|w_3|=0.7$, and $|w_4|=0.1$. Ordering according to formula (3), above, produces the following:

$$|w_2| \geq |w_3| \geq |w_1| \geq |w_4|,$$

which means $i_1=2$, $i_2=3$, $i_3=1$, and $i_4=4$.

The indices tell which weights will be updated at the $k^{th}$ stage. At k=1, only $w_2$ is updated, while all other weights are forced to zeros. The adaptive filter 200 is run again repeatedly until the convergence of weight, $w_2$. After the convergence of $w_2$, at k=2, both $w_2$ and $w_3$ are updated simultaneously, while all other weights, starting with weight, $w_3$, are forced to zero. The adaptive filter 200 is run again repeatedly until the convergence of the first two weights, $w_2$ and $w_3$. After the convergence of $w_2$ and $w_3$, three weights, $w_2$, $w_3$ and $w_1$, are updated, with the remaining weights being forced to zero. This process is repeated until all weights making up the vector, w, are updated, the adaptive filter 200 is run, and the weights converge.

Figure 4:
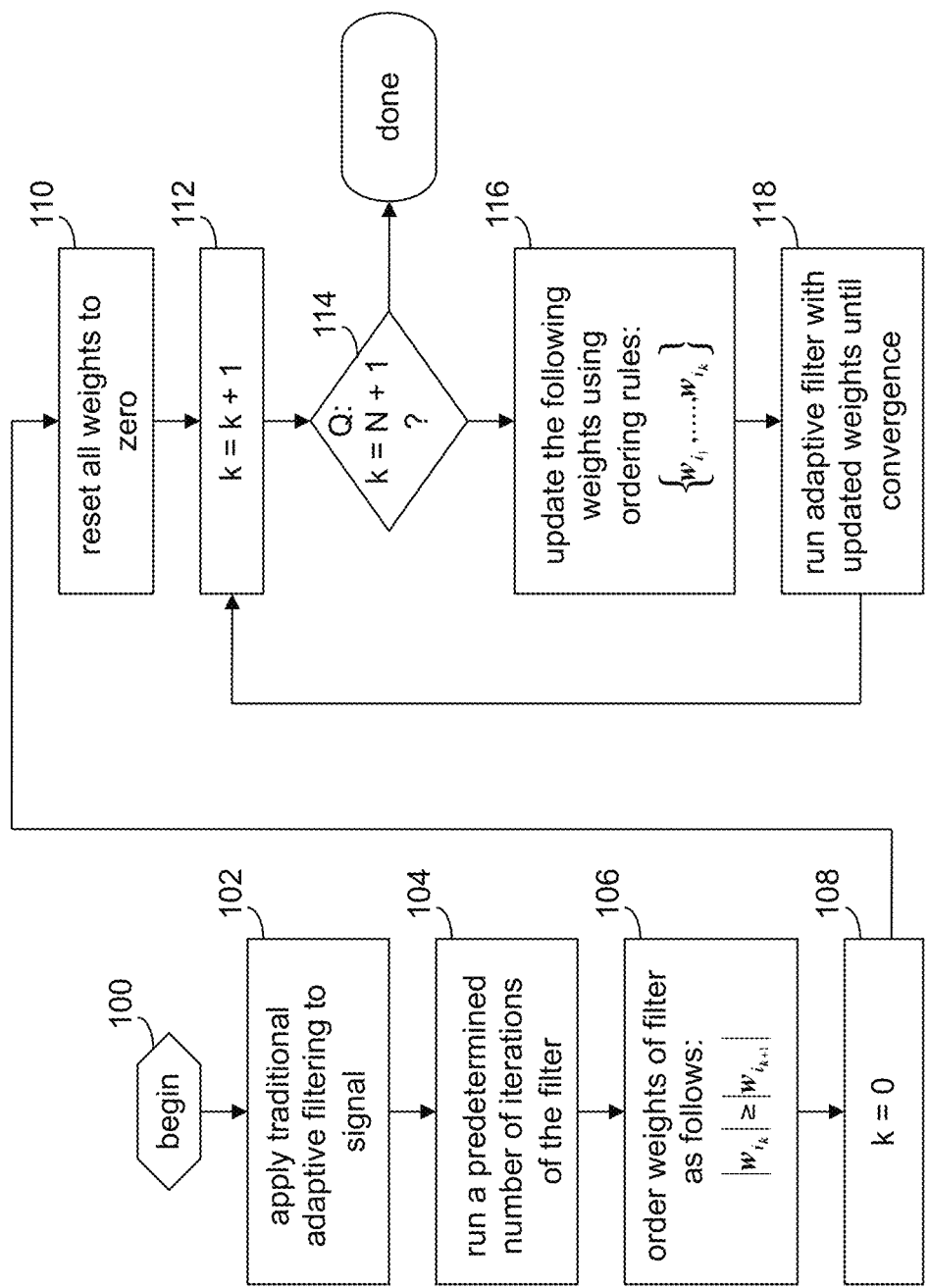
FIG. 4 is a flow diagram showing operations performed by the multi-stage adaptive filter of FIG. 1, according to some embodiments.

FIG. 4 is a flow diagram showing the method employed by the multi-stage adaptive filter 100 of FIG. 1, according to some embodiments. Before the filter weights 50 are manipulated by the software 60, the incoming signal 20 is fed into the filter 200 and traditional adaptive filtering is applied (block 102) for a predetermined number of iterations (block 104). This enables the weights 50 to be assigned values that are in the neighborhood of the desired values.

The weights 50 are ordered as given in formula (3), above (block 106). Then, the integer, k, is reset (block 108) and all the weights 50 are set to zero (block 110). The integer is incremented (block 112) and then, one by one, the zeroed weights are updated (block 116) and the adaptive filter 200 is run until the weights converge (block 118). The process repeats until all the zeroed weights are updated (block 114).

Figure 5:
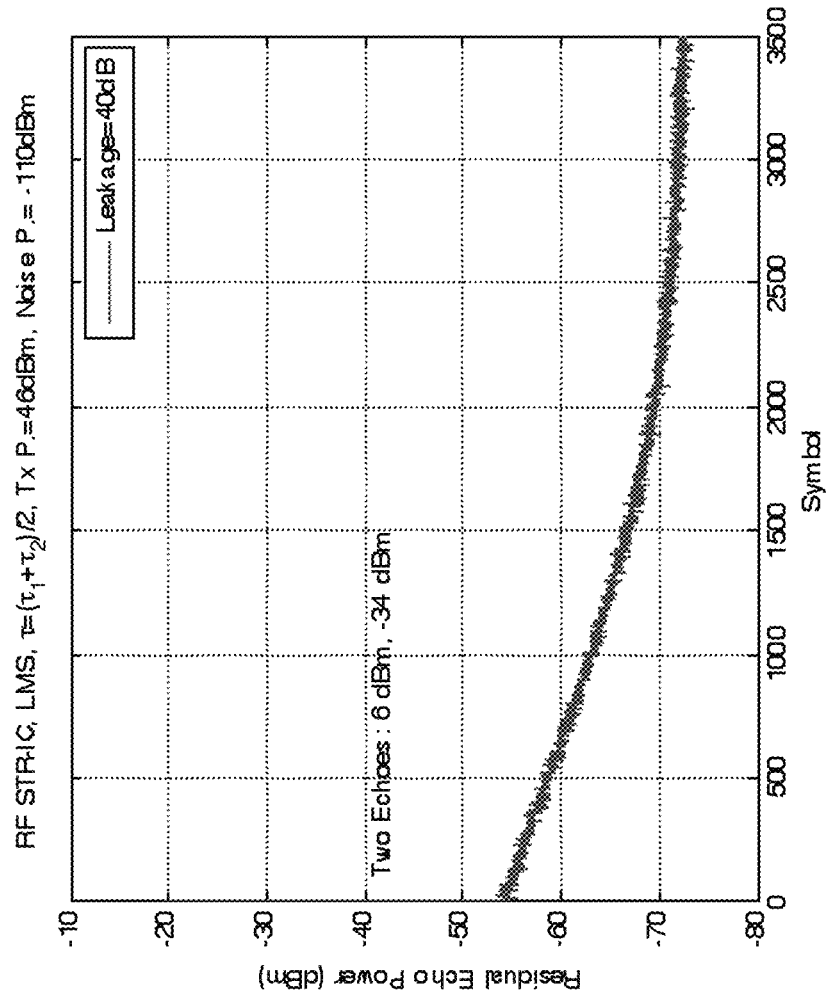
FIG. 5 is a graph showing the convergence and residual echo power found in a signal filtered using a least mean squared adaptive filter, according to some embodiments.
Figure 6:
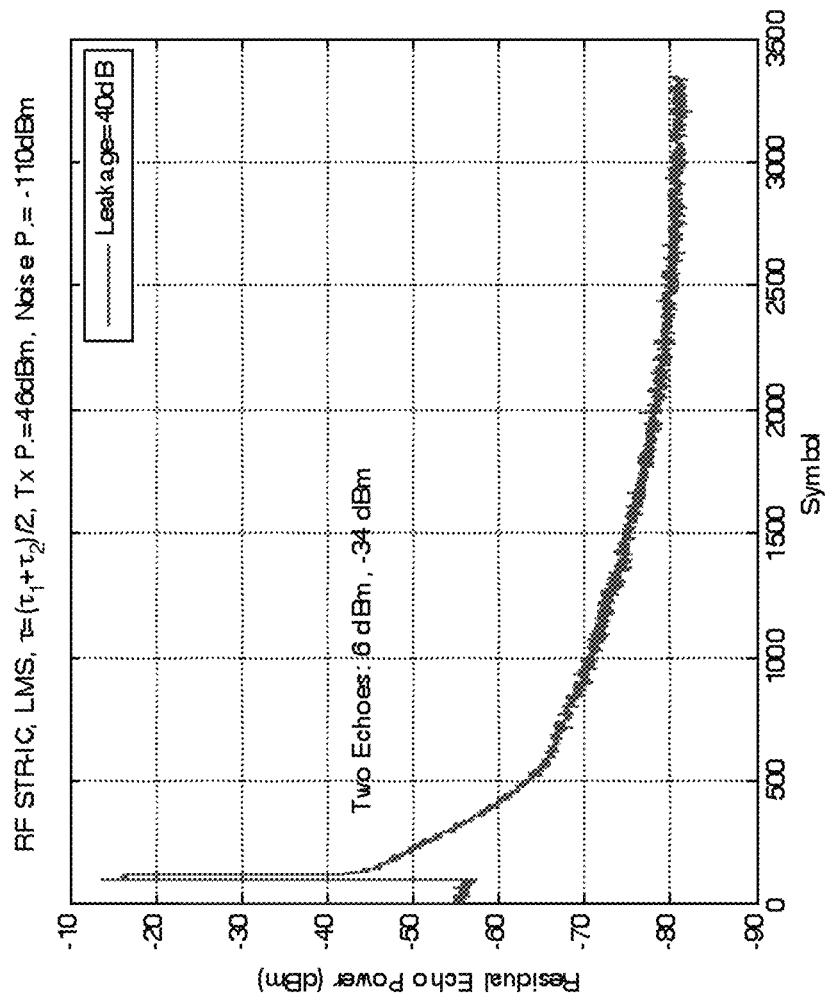
FIG. 6 is a graph showing the convergence and residual echo power found in a signal filtered using the multi-stage adaptive filter of FIG. 1, according to some embodiments.

FIG. 5 shows the convergence of the least mean square algorithm in an echo canceller, according to some embodiments. The residual echo power after convergence is −72 dBm. In contrast, FIG. 6 shows the echo canceller with the multi-stage adaptive filter 100 of FIG. 1. Where the adaptive filter 100 is used, the residual echo power in the multi-stage adaptive filter is −82 dBm.

Figure 7:
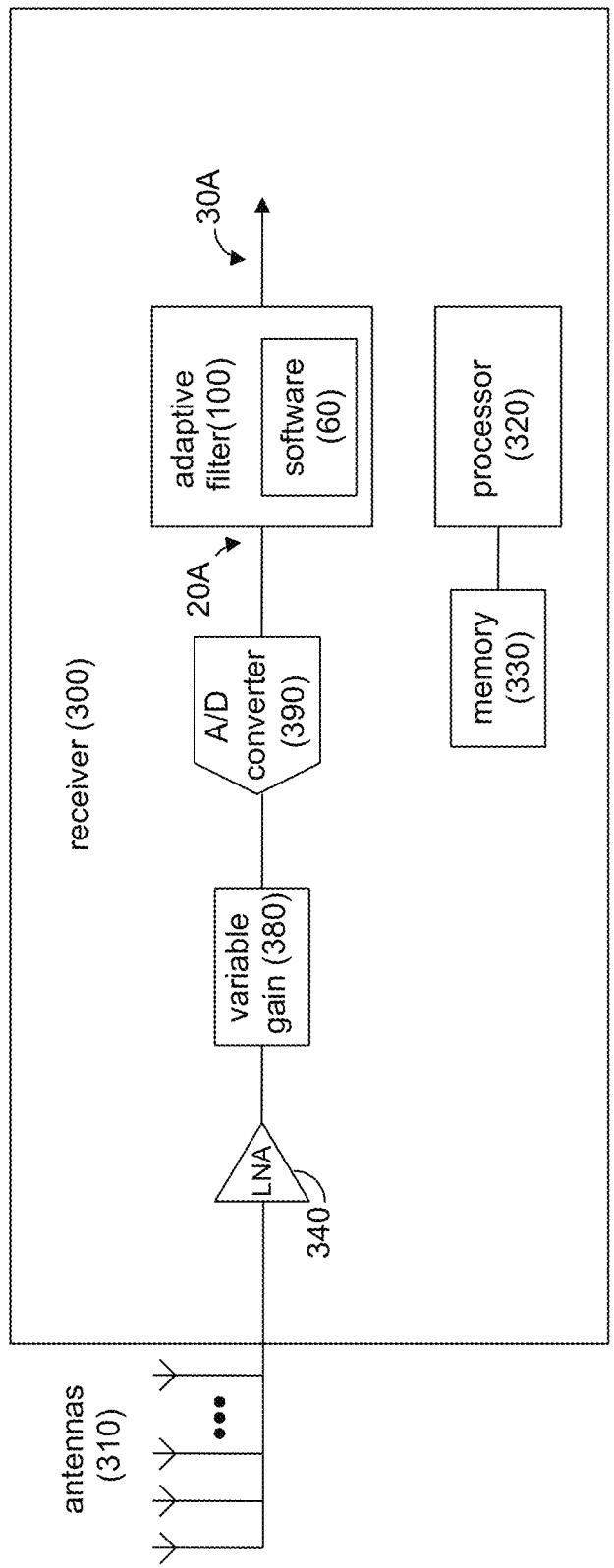
FIG. 7 is a block diagram of a system employing a receiver that uses the multi-stage adaptive filter of FIG. 1, according to some embodiments.

FIG. 7 is a block diagram of a portion of a receiver 300, where the receiver employs the multi-stage adaptive filter 100 of FIG. 1, according to some embodiments. The receiver 300, which may be part of a cell phone, personal digital assistant or other device, includes a processor 320 and a memory 330, the processor to execute the software 60 of the adaptive filter 100. The software 60 runs the iterations and, in multiple stages, programs the weights of the adaptive filter 100, as described above. The receiver 300 includes many other circuits not shown in FIG. 7. One or more antennas 310 receive an incoming signal, which is fed into a low noise amplifier 340 before being fed into a variable gain amplifier, and converted to a digital signal 20A by an analog-to-digital converter 390. The digital signal 20A is fed into the adaptive filter 100 and processed as outgoing signal 30A. As described above, the adaptive filter 100 is able to take a signal coming into the receiver 300 and strip away any undesired additional signaling that is received during transmission over the air.

While the application has been described with respect to a limited number of embodiments, those skilled in the art will appreciate numerous modifications and variations therefrom. It is intended that the appended claims cover all such modifications and variations as fall within the true spirit and scope of the invention.

I claim:

1. A method to process an incoming digital signal in a receiver, the method comprising:
   receiving an analog signal by one or more antennas of the receiver;
   converting the analog signal to the incoming digital signal by an analog-to-digital converter;
   running an adaptive filter on the incoming digital signal, the adaptive filter to be controlled by a software program loaded into a memory of the receiver and executed by a processor operating within the receiver, the software program to:
   receive a weight vector, w, the weight vector comprising a plurality of weights, $w=[w_1, w_2, \ldots w_N]$, to be used by the adaptive filter, wherein each weight corresponds to a tap of the adaptive filter;
   execute the adaptive filter for a predetermined number of iterations, the plurality of weights having original values, $|w_1|, |w_2|, \ldots, |w_N|$, following the iterations;
   order the original values, $|w_1|, |w_2|, \ldots, |w_N|$, of the plurality of weights, $w=[w_1, w_2, \ldots, w_N]$ to produce a new weight vector, $wnew=[w_{i_1}, w_{i_2}, \ldots w_{i_N}]^T$ according to a formula $|w_{i_k}| \geq |w_{i_{k+1}}|$, for index, $i_k$;
   set each of the plurality of weights of the new weight vector to zero; and
   for k=1 to N:
      update the k weights, $w_{i_1}, w_{i_2}, \ldots w_{i_k}$, of the new weight vector; and
      repeatedly run the adaptive filter using the new weight vector until the k weights, $w_{i_1}, w_{i_2}, \ldots w_{i_k}$, converge;
   wherein a filter signal having fewer errors than the incoming digital signal is generated following the software operations inside the receiver.

2. The method of claim 1, updating the k weights, $w_{i_1}, w_{i_2}, \ldots w_{i_k}$, of the new weight vector further comprising:
   updating the k weights, $w_{i_1}, w_{i_2}, \ldots w_{i_k}$, of the new weight vector using a least mean square algorithm.

3. The method of claim 2, updating the k weights, $w_{i_1}, w_{i_2}, \ldots w_{i_k}$, of the new weight vector further comprising:
   using the following equation to update the k weights, $w_{i_1}, w_{i_2}, \ldots w_{i_k}$, $$w = w + \mu x^* e$$

wherein x corresponds to the incoming digital signal and $x=[x(n), x(n-1), \ldots, x(n-N+1)]^T$, $[w=[w_1, w_2, \ldots w_N]^T]$ w=wnew, $\mu$ is a step size, and e is an error signal calculated from a desired signal and the output signal.

4. The method of claim 1, updating the k weights, $w_{i_1}, w_{i_2}, \ldots w_{i_k}$, of the new weight vector further comprising:
   updating the k weights, $w_{i_1}, w_{i_2}, \ldots w_{i_k}$, of the new weight vector using a constant modulus algorithm.

5. The method of claim 4, the incoming digital signal comprising a desired signal and a cost function, the cost function comprising a global minimum and one or more local minimums;
wherein the new weight vector, $w_{new}$, falls into the global minimum of the cost function after the N iterations of the adaptive filter are run.

6. The method of claim 1, wherein the receiver comprises an echo canceller.

7. The method of claim 1, wherein the predetermined number of iterations is based on a signal-to-noise ratio of the incoming digital signal.

8. The method of claim 1, wherein the predetermined number of iterations is based on an eigenvalue spread of an autocorrelation matrix of the incoming digital signal.

9. A receiver, comprising:
one or more antennas to receive an analog signal;
an analog-to-digital converter to change the analog signal to a digital signal;
an adaptive filter to receive the digital signal and to generate a new digital signal; and
a software program to be loaded into a memory of the receiver, the software program to be executed by a processor, the software program to control the execution of the adaptive filter, the software program to further feed a plurality of weights into the adaptive filter, wherein the plurality of weights is denoted by original values, $|w_1|$, $|w_2|, \ldots, |w_N|$, and wherein each weight corresponds to a tap of the adaptive filter;
wherein the software program:
executes the adaptive filter for a predetermined number of iterations, such that the plurality of weights, following the iterations, have values, $|w_1|, |w_2|, \ldots, |w_N|$;
orders the original values, $|w_1|, |w_2|, \ldots, |w_N|$ of the plurality of weights, $w=[w_1, w_2, \ldots, w_N]$, to produce a new weight vector, $wnew=[w_{i_1}, w_{i_2}, \ldots w_{i_N}]^T$ according to a formula, $|w_{i_k}| \geq |w_{i_{k+1}}|$, for index, $i_k$;
sets each of the plurality of weights of the weight vector to zero; and
for k=1 to N:
updates the k weights, $w_{i_1}, w_{i_2}, \ldots w_{i_k}$, of the new weight vector; and
repeatedly runs the adaptive filter using the new weight vector until the k weights, $w_{i_1}, w_{i_2}, \ldots w_{i_k}$, converge;
wherein the digital signal is replaced with the new digital signal in the receiver.

10. The receiver of claim 9, wherein the new digital signal has fewer errors than the incoming digital signal.

11. The receiver of claim 9, wherein the incoming digital signal comprises a desired signal and a cost function, the cost function comprising a global minimum and one or more local minimums;
wherein the new weight vector falls into the global minimum of the cost function after the N iterations of the adaptive filter are run.

12. The receiver of claim 9, wherein the receiver is an echo canceller.

13. The receiver of claim 9, wherein the receiver is a channel identifier apparatus.

14. The receiver of claim 9, wherein the predetermined number of iterations is based on a signal-to-noise ratio of the incoming digital signal.

15. The receiver of claim 9, wherein the predetermined number of iterations is based on an eigenvalue spread of an autocorrelation matrix of the incoming digital signal.

16. A non-transitory computer-readable medium storing a software program which, when executed by a processor of a receiver, performs the following operations:
generate a plurality of original weights to be received by an adaptive filter, the plurality of original weights being denoted by, $w=[w_1, w_2, \ldots, w_N]$, wherein each weight corresponds to a tap of the adaptive filter;
execute the adaptive filter on an incoming digital signal for a predetermined number of iterations, wherein the plurality of original weights have values, $|w_1|, |w_2|, \ldots, |w_N|$, following the iterations, wherein the incoming digital signal is received as an analog signal from one or more antennas of the receiver and converted to the incoming digital signal by an analog-to-digital converter;
order the original values, $|w_1|, |w_2|, \ldots, |w_N|$, of the plurality of weights, $w=[w_1, w_2, \ldots, w_N]$ to produce a new weight vector, $wnew=[w_{i_1}, w_{i_2}, \ldots w_{i_N}]^T$ according to a formula $|w_{i_k}| \geq |w_{i_{k+1}}|$, for index, $i_k$;
set each of the plurality of weights of the weight vector to zero;
for k=1 to N:
update the k weights, $w_{i_1}, w_{i_2}, \ldots w_{i_k}$, of the new weight vector; and
repeatedly run the adaptive filter using the new weight vector until the k weights, $w_{i_1}, w_{i_2}, \ldots w_{i_k}$, converge;
wherein an output signal is generated that has fewer error than the incoming digital signal, the output signal to be used by the receiver.

17. The non-transitory computer-readable medium of claim 16, the software program, when executed, to further:
update the k weights, $w_{i_1}, w_{i_2}, \ldots w_{i_k}$, of the new weight vector using a least mean square algorithm.

18. The non-transitory computer-readable medium of claim 17, the software program, when executed, to further:
use the following equation to update the k weights, $w_{i_1}, w_{i_2}, \ldots w_{i_k}$:

$$w = w + \mu x^* e$$

wherein x corresponds to the incoming digital signal and $x=[x(n), x(n-1), \ldots, x(n-N+1)]^T$, $[w=[w_1, w_2, \ldots, w_N]^T]$ w=wnew, $\mu$ is a step size, and e is an error signal calculated from a desired signal and the output signal.

19. The non-transitory computer-readable medium of claim 16, the software program, when executed, to further:
update the k weights, $w_{i_1}, w_{i_2}, \ldots w_{i_k}$, of the new weight vector using a constant modulus algorithm.

20. The non-transitory computer-readable medium of claim 16, wherein the adaptive filter is run to perform echo cancellation.

* * * * *